(12) United States Patent
Dobner et al.

(10) Patent No.: US 12,308,359 B2
(45) Date of Patent: May 20, 2025

(54) OPTOELECTRONIC COMPONENT AND METHOD FOR PRODUCING THE SAME

(71) Applicant: OSRAM Opto Semiconductors GmbH, Regensburg (DE)

(72) Inventors: Andreas Dobner, Wenzenbach (DE); Andreas Waldschik, Wolmirstedt (DE); Matthias Goldbach, Pentling (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 444 days.

(21) Appl. No.: 17/762,142

(22) PCT Filed: Oct. 8, 2020

(86) PCT No.: PCT/EP2020/078302
§ 371 (c)(1),
(2) Date: Mar. 21, 2022

(87) PCT Pub. No.: WO2021/074009
PCT Pub. Date: Apr. 22, 2021

(65) Prior Publication Data
US 2022/0352135 A1    Nov. 3, 2022

(30) Foreign Application Priority Data
Oct. 15, 2019   (DE) .................... 10 2019 127 783.3

(51) Int. Cl.
*H01L 25/16*   (2023.01)
*H01L 23/495*  (2006.01)
(Continued)

(52) U.S. Cl.
CPC ...... *H01L 25/167* (2013.01); *H01L 23/49541* (2013.01); *H01L 23/49575* (2013.01); *H10H 20/857* (2025.01); *H10H 20/0364* (2025.01)

(58) Field of Classification Search
CPC ............ H01L 25/167; H01L 23/49541; H01L 23/49575; H01L 33/62; H01L 2933/0066
See application file for complete search history.

(56) References Cited

U.S. PATENT DOCUMENTS

2003/0011054 A1* 1/2003 Jeun ................. H01L 23/49575
                                                          257/E23.092
2009/0173953 A1* 7/2009 Liu ....................... H01L 25/167
                                                                 257/82
(Continued)

FOREIGN PATENT DOCUMENTS

DE    10 2013 225 552 A1    6/2015
DE    10 2017 124 321 A1    4/2019
(Continued)

OTHER PUBLICATIONS

International Search Report issued for corresponding International Patent Application No. PCT/EP2020/078302 on Dec. 23, 2020, along with an English translation.
(Continued)

*Primary Examiner* — Timor Karimy
(74) *Attorney, Agent, or Firm* — Hauptman Ham, LLP

(57) ABSTRACT

An optoelectronic component includes at least one optoelectronic semiconductor chip with a main surface on which two electrical contacts are arranged. The optoelectronic component also includes a control chip for controlling the optoelectronic semiconductor chip with a plurality of electrical connection pads. The optoelectronic component further includes a housing with a housing body. The optoelectronic semiconductor chip is arranged with a mounting surface, which extends transversely to the main surface, in a first recess of the housing body. A side surface of the first recess forms an obtuse tilt angle with a bottom surface of the first recess. At least one of the electrical contacts of the optoelectronic semiconductor chip is electrically conductively (Continued)

Figure 1A:
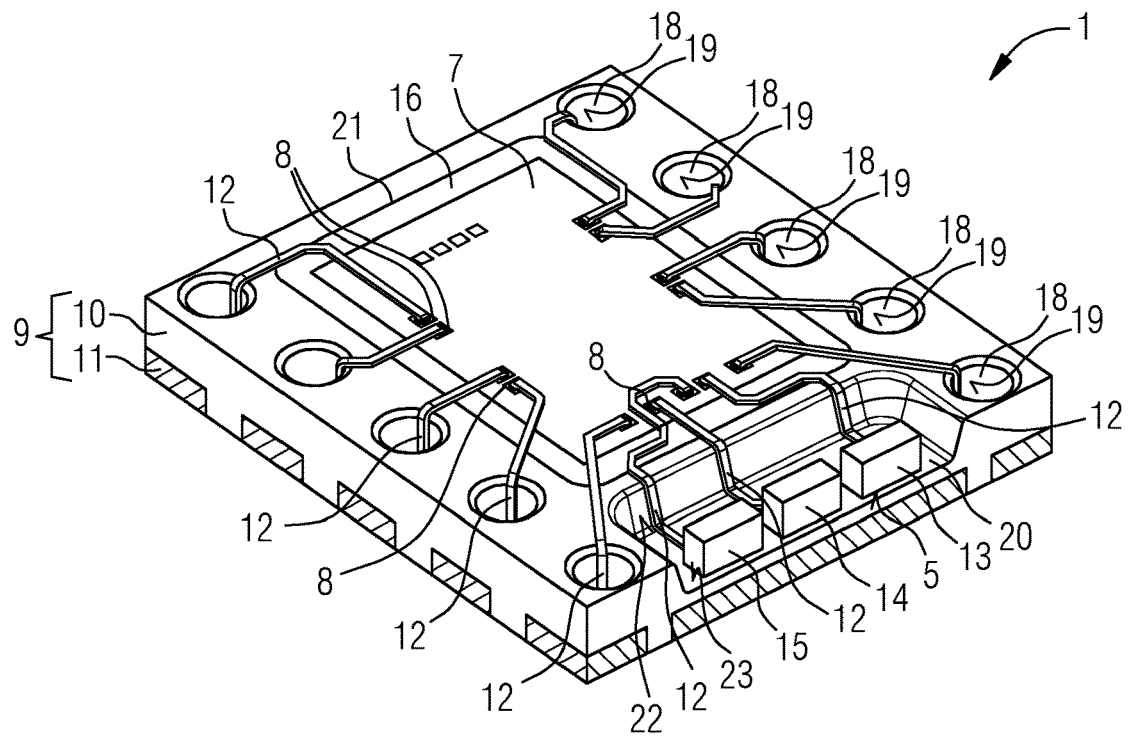

connected to an electrical connection pad of the control chip via a conductor path. The conductor path is arranged at least in places on the side surface of the first recess.

17 Claims, 8 Drawing Sheets

(51) Int. Cl.
  *H10H 20/857* (2025.01)
  *H10H 20/01* (2025.01)

(56) References Cited

U.S. PATENT DOCUMENTS

| | | |
|---|---|---|
| 2009/0174048 A1 | 7/2009 | Liu et al. |
| 2011/0266040 A1 | 11/2011 | Kim et al. |
| 2014/0312378 A1 | 10/2014 | Hsue |
| 2016/0087177 A1 | 3/2016 | Schwarz et al. |
| 2017/0285281 A1 | 10/2017 | Aikou |
| 2017/0345800 A1 | 11/2017 | Kobayakawa |
| 2020/0303594 A1 | 9/2020 | Sorg et al. |

FOREIGN PATENT DOCUMENTS

| | | |
|---|---|---|
| JP | H8-264842 A | 10/1996 |
| JP | 2007-110059 A | 4/2007 |
| JP | 2014-56370 A | 3/2014 |

OTHER PUBLICATIONS

Written Opinion issued for corresponding International Patent Application No. PCT/EP2020/078302 on Dec. 23, 2020.
Meizhen Gao et al., "LED display drive BN5279(A) and its application of the series port", Foreign Electronic Elements, Issue 6, Jun. 25, 2005, pp. 69-72, along with an English Abstract.
Jongbok Baek et al., "AC LED Driver with High Power Factor and Balanced Brightness for Segmented LED strings", Proceedings of the IECON 2016—42nd Annual Conference of the IEEE Industrial Electronics Society, May 24, 2017, pp. 31-35.

* cited by examiner

OPTOELECTRONIC COMPONENT AND METHOD FOR PRODUCING THE SAME

CROSS REFERENCE TO RELATED APPLICATION

This application is a National Stage of International Application No. PCT/EP2020/078302, filed on Oct. 8, 2020, which designates the United States and was published in Europe, and which claims priority to German Patent Application No. 10 2019 127 783.3, filed on Oct. 15, 2019, in the German Patent Office. Both of the aforementioned applications are hereby incorporated by reference in their entireties.

An optoelectronic component is specified. Furthermore, a method for manufacturing an optoelectronic component is specified.

An object to be solved is, inter alia, to specify an optoelectronic component characterized by a particularly low height. Another object to be solved is, inter alia, to specify a method for manufacturing such an optoelectronic component.

These objects are achieved by the subject matter with the features of independent patent claim 1 and by a method with the features of independent patent claim 13, respectively. Advantageous embodiments and further developments are the subject of the respective dependent patent claims.

According to at least one embodiment of the optoelectronic component, the latter comprises an optoelectronic semiconductor chip with a main surface on which two electronic contacts are arranged. For example, this is a radiation-emitting semiconductor chip, preferably a light-emitting diode chip.

For example, the optoelectronic semiconductor chip is a flip-chip type semiconductor chip. An optoelectronic semiconductor chip of flip-chip type is also referred to as a flip-chip herein and hereinafter.

The optoelectronic semiconductor chip preferably comprises an epitaxial semiconductor layer sequence with a p-type region, an n-type region, and an active region arranged between the p-type region and the n-type region. The active region is configured to generate electromagnetic radiation during operation. In particular, the active region comprises a main extension plane extending parallel to the main surface of the optoelectronic semiconductor chip.

For example, the epitaxial semiconductor layer sequence of the optoelectronic semiconductor chip is based on a nitride compound semiconductor material, such as $Al_n In_{1-n-m} Ga_m N$, wherein $0 \leq n \leq 1$, $0 \leq m \leq 1$, and $m+n \leq 1$. Such a semiconductor layer sequence typically comprises an active region that generates electromagnetic radiation from the ultraviolet to blue spectral range. Furthermore, it is also possible that the epitaxial semiconductor layer sequence of the optoelectronic semiconductor chip is based on a phosphide compound semiconductor material, such as $Al_n In_{1-n-m} Ga_m N$, wherein $0 \leq n \leq 1$, $0 \leq m \leq 1$, and $m+n \leq 1$. Such an epitaxial semiconductor layer sequence usually comprises an active region that generates electromagnetic radiation from the green to red spectral range.

Generally, the epitaxial semiconductor layer sequence is epitaxially grown on a growth substrate. The epitaxial semiconductor layer sequence is usually arranged on a carrier element for mechanical stabilization. For example, the growth substrate is used as the carrier element. Furthermore, it is also possible that the epitaxial semiconductor layer sequence is transferred from the growth substrate to a carrier element. Preferably, the carrier element is at least transmissive to the electromagnetic radiation generated in the active region of the epitaxial semiconductor layer sequence. Preferably, each of the growth substrate or the carrier substrate comprises sapphire or carbide or is made of one of these materials.

The flip-chip type optoelectronic semiconductor chip preferably emits the electromagnetic radiation generated in the active region via a main outer surface of the carrier element and side surfaces of the carrier element. In particular, the main outer surface of the carrier element faces the epitaxial semiconductor layer sequence. The side surfaces of the carrier element extend transversely to the main outer surface and connect the main outer surface of the carrier element with the surface of the carrier element facing the semiconductor layer sequence. In other words, the radiation exit surface of the carrier element and side surfaces of the carrier element form a radiation exit surface of the flip-chip. Such a flip-chip is a so-called volume emitter. The radiation exit surface of the flip-chip is particularly preferably free of electrical contacts. Alternatively, the optoelectronic semiconductor chip emits electromagnetic radiation via a main outer surface of the semiconductor chip that is opposite to the carrier element. In particular, in this embodiment, the main outer surface forms a radiation emitting surface of the flip-chip. Such an optoelectronic semiconductor chip is in particular a so-called surface emitter.

In particular, substantially all of the radiation emitted by the optoelectronic semiconductor chip is emitted via the radiation exit surface.

The electrical contacts of the flip-chip type optoelectronic semiconductor chips are preferably arranged on a main surface of the optoelectronic semiconductor chip facing away from the main outer surface.

According to at least one embodiment, the optoelectronic component includes a control chip for controlling the semiconductor chip with a plurality of electrical connection pads. In particular, the optoelectronic semiconductor chip is energized and operated in a controlled manner via the control chip during intended operation. For example, the control chip is a microcontroller or an integrated circuit, in particular an application-specific integrated circuit, ASIC for short.

According to at least one embodiment, the optoelectronic component comprises a housing with a housing body. For example, the housing body comprises epoxy or is formed thereof. In particular, reflective particles, for example titanium dioxide particles, are embedded in a base material of the semiconductor body, such as polyepoxy.

According to at least one embodiment of the optoelectronic component, the optoelectronic semiconductor chip is arranged in a first recess of the housing body with a mounting surface extending transversely to the main surface. For example, the optoelectronic semiconductor chip is mounted in the first recess with a bonding agent. The bonding agent is, for example, an electrically insulating adhesive. The electrically insulating adhesive is based, for example, on silicone or epoxy. In particular, the adhesive is arranged between the mounting surface of the semiconductor chip and the housing body and is in direct contact with both. Advantageously, an electrically insulating bonding agent prevents short-circuiting of the n-type region and the p-type region in the mounting surface region.

For example, the first recess is filled with a transparent casting. For example, the transparent casting is based on a silicone. In particular, the first casting is transparent to the radiation emitted by the optoelectronic semiconductor chip. By "transparent" it is understood here and in the following that at least 90%, preferably at least 95%, further preferably at least 99%, of the radiation emitted by the optoelectronic semiconductor chip penetrates the transparent casting unchanged.

According to at least one embodiment of the optoelectronic component, a side surface of the first recess forms an obtuse tilt angle with a bottom surface of the first recess. Preferably, the side surface is reflective to radiation emitted from the semiconductor chip. For example, at least 80% or at least 90% or at least 95% of the radiation incident on the side surface is reflected. Further preferably, all other interior surfaces of the first recess are also reflective.

For example, the first recess comprises an opening facing the side surface. Preferably, electromagnetic radiation emitted via the radiation exit surface of the optoelectronic semiconductor chip can exit the first recess through the opening.

According to at least one embodiment of the optoelectronic component, at least one of the electrical contacts of the optoelectronic semiconductor chip is electrically conductively connected via a conductor path with an electrical connection pad of the control chip. Preferably, the conductor path comprises one or more metals or is formed from one or more metals. The metals are, for example, copper, gold or platinum.

According to at least one embodiment of the optoelectronic component, the conductor path is applied at least in places to the side surface of the first recess. In particular, the first conductor path is in direct contact with the side surface of the first recess in places. Preferably, the conductor path is in direct contact with the side surface of the first recess over its entire course along the side surface of the first recess. Further preferably, the conductor path is in direct contact with the housing and the optoelectronic semiconductor chip and the control chip along its entire course.

In at least one embodiment, the optoelectronic component comprises at least one optoelectronic semiconductor chip with a main surface having two electrical contacts arranged thereon, a control chip for controlling the semiconductor chip with a plurality of electrical connection pads, and a housing having a housing body. The optoelectronic semiconductor chip is arranged with a mounting surface extending transversely to the main surface at a first recess of the housing body. A side surface of the first recess forms an obtuse angle with a bottom surface of the first recess. At least one of the electrical contacts of the optoelectronic semiconductor chip is electrically conductively connected to an electrical connection pad of the control chip via a conductor path, wherein the conductor path is applied at least in places to the side surface of the first recess.

Among others, an optoelectronic component described here is based on the considerations set out below. Conventionally, a radiation-emitting semiconductor chip is mounted on a leadframe and the electrical contacts of the leadframe are bent over to form an optoelectronic component in which radiation is emitted transverse to the mounting surface of the device. If a control chip is to be integrated into the optoelectronic component, the height of the optoelectronic component is usually increased. Typically, the radiation-emitting semiconductor chip is then arranged on an additional carrier and connected to the control chip by means of bonding wires.

An optoelectronic component described herein now makes use, among others, of the idea of mounting the optoelectronic semiconductor chip in a housing on a mounting surface extending transversely to the main surface. Via a side surface of the recess in which the semiconductor chip is mounted and which forms an obtuse tilt angle to the bottom surface of the first recess, conductor paths connecting the semiconductor chip with the control chip can be guided directly along the surface of the housing body and the control chip.

Advantageously, this allows the overall height of the optoelectronic component to be reduced. In particular, since conductor paths resting on the housing body are used for electrical contacting of the semiconductor chip instead of bonding wire connections, a height of the component of less than 0.4 millimeters or preferably less than 0.3 millimeters can be achieved. In addition, the electronic semiconductor chip can be controllably operated by the control chip. For example, the optoelectronic component described herein can be used to operate a display or to illuminate a display.

According to at least one embodiment of the optoelectronic component, the tilt angle between the side surface of the first recess and the bottom surface of the first recess comprises a value between 105° and 165°, inclusive. Advantageously, the conductor path can be guided along particularly easily on a side surface which is inclined with such an angle with respect to the bottom surface.

According to at least one embodiment of the optoelectronic component, the housing body comprises a second recess in which the control chip is arranged. In particular, inner surfaces of the second recess completely surround the control chip in lateral directions. In the following, the term "lateral direction" is understood to mean a direction that runs parallel to the main extension plane of the control chip. For example, the electrical connection pads of the control chip are arranged on a common connection surface. The connection surface of the control chip is, for example, a surface of the control chip facing away from the housing. Preferably, the control chip is arranged in the housing such that the connection surface of the control chip extends transversely, in particular perpendicularly, to the main surface of the optoelectronic semiconductor chip.

For example, the second recess is filled with an electrically insulating casting. For example, side surfaces of the control chip extending transversely to the connection surface can be electrically conductive. In this case, guiding the conductor path along the side surfaces of the control chip can lead to a short circuit. Such a short circuit can advantageously be avoided by an electrically insulating casting. For example, the electrically insulating casting is based on a silicone or epoxy material or is formed from one of these materials.

In particular, the casting does not protrude beyond the control chip perpendicular to the lateral direction. Preferably, the control chip, the casting and the recess are flush with each other. Advantageously, this makes it particularly easy to guide a conductor path from the housing body to the control chip.

According to at least one embodiment of the optoelectronic component, the bottom surface of the first recess is electrically insulated at least in the region of the mounting surface of the optoelectronic semiconductor chip. For example, the active region of the semiconductor chip extends parallel to the main surface. Advantageously, a short circuit of the p- and n-conducting region of the semiconductor chip can be avoided by an electrically insulated bottom surface.

According to at least one embodiment of the optoelectronic component, the housing comprises a leadframe with a plurality of contact regions embedded in the housing body. The electrical connection pads of the control chip are each electrically conductively connected with a part of the contact regions via conductor paths, wherein the conductor paths are applied to the housing body at least in places. For example, the control chip is energized via the leadframe. In particular, during intended operation, electrical signals are conducted to the control chip via the leadframe, on the basis of which the control chip controls and operates the optoelectronic semiconductor chip.

According to at least one embodiment of the optoelectronic component, the housing comprises a leadframe with a plurality of contact regions embedded in the housing body. Electrical contacts of the optoelectronic semiconductor chip are electrically conductively connected to a part of the contact regions of the leadframe via conductor paths, wherein each of the conductor paths is applied to the housing body at least in places. For example, the semiconductor chip comprises two electrical contacts on its main surface. In particular, one of the electrical contacts is electrically conductively connected with the control chip and the second electrical contact is electrically conductively connected with the leadframe. For example, the optoelectronic semiconductor chip is energized via the leadframe.

According to at least one embodiment of the optoelectronic component, the contact regions of the leadframe are freely accessible through cutouts of the housing body, and the cutouts comprise side surfaces that form an obtuse tilt angle with the contact regions of the leadframe. In particular, the tilt angle is measured between each of the exposed regions of the contact regions and the side surface of a cutout. For example, the tilt angle of the side surfaces of the cutouts comprises a value in the same range of values as the tilt angle of the side surface of the first recess relative to the bottom surface of the first recess.

According to at least one embodiment of the optoelectronic component, the conductor paths which electrically conductively connect electrical connection pads of the control chip with a part of the contact regions are applied to the side surfaces of the cutouts, respectively. Advantageously, the contact regions are particularly easily accessible through the cutouts. Furthermore, the conductor path can be guided along the side surfaces of the cutouts particularly easily due to the obtuse tilt angle relative to the contact regions of the leadframe.

According to at least one embodiment of the optoelectronic component, the conductor paths that electrically conductively connect the electrical connection pads of the optoelectronic semiconductor chip with the contact regions are applied to side surfaces of the cutouts. Preferably, the cutouts are arranged in the region of the bottom surface of the first recess. Advantageously, this means that the conductor path only has to be guided over a short distance.

According to at least one embodiment of the optoelectronic component, the mounting surface of the optoelectronic semiconductor chip forms an acute tilt angle with the main surface of the optoelectronic semiconductor chip. In particular, this tilt angle is measured between sides of the mounting surface and the main surface that lie within the optoelectronic semiconductor chip. Thus, the main surface of the optoelectronic semiconductor chip forms an obtuse angle with the bottom surface of the first recess. Advantageously, such an obtuse angle makes it particularly easy to connect an electrical conductor path with the electrical contacts of the semiconductor chip.

According to at least one embodiment, the optoelectronic component comprises at least three optoelectronic semiconductor chips. In this case, the optoelectronic component comprises an optoelectronic semiconductor chip that emits light in the red spectral range, an optoelectronic semiconductor chip that emits light in the green spectral range, and an optoelectronic semiconductor chip that emits light in the blue spectral range. Preferably, each of the optoelectronic semiconductor chips is a flip-chip. For example, the three optoelectronic semiconductor chips are arranged in the first recess along a line that is parallel to the side surface of the first recess. Preferably, each of the three optoelectronic semiconductor chips is connected to a different electrical connection pad of the control chip via a respective conductor path. For example, the control chip controls the optoelectronic semiconductor chips such that the optoelectronic component emits mixed light of a selected color location. For example, the mixed light is perceived as white light by a human observer.

For example, the optoelectronic semiconductor chip that emits light in the blue spectral range is based on a nitride compound semiconductor material. For example, the optoelectronic semiconductor chips emitting light in the red and green spectral ranges are each based on a phosphide compound semiconductor material.

According to at least one embodiment, the optoelectronic component alternatively comprises three semiconductor chips emitting electromagnetic radiation of a first wavelength range. In this case, the first recess is divided into three sections separated from each other, wherein one optoelectronic semiconductor chip is arranged in each section. At least two sections comprise two different conversion materials that convert the electromagnetic radiation of a first wavelength range into electromagnetic radiation of different wavelength ranges. For example, the optoelectronic semiconductor chips emit light of a blue wavelength range. In particular, one of the conversion materials is configured to convert the light of the blue wavelength range into light of a red wavelength range. The other conversion material is then configured, for example, to convert the light of the blue wavelength range into light of a green wavelength range.

For example, parting surfaces that separate the first recess into three distinct sections extend perpendicular to the side surface on which the conductor paths are arranged. Preferably, the section that is not filled with a conversion material is filled with a clear casting.

Furthermore, a method for manufacturing an optoelectronic component is specified. In particular, the optoelectronic component described herein can be produced by such a method. That is, all features disclosed for the optoelectronic component are also disclosed for the method, and vice versa.

According to at least one embodiment of the method, a housing is provided with a housing body comprising a first recess. A side surface of the first recess forms an obtuse tilt angle with a bottom surface of the first recess. Preferably, the tilt angle comprises a value between 105° and 165°, inclusive.

According to at least one embodiment of the method, a control chip is arranged with a plurality of electrical connection pads on the housing body. For example, the housing body includes a second recess in which the control chip is arranged.

According to at least one embodiment of the method, at least one optoelectronic semiconductor chip is arranged with a mounting surface in the first recess. The mounting surface extends transversely to a main surface of the semiconductor chip, on which two electrical contacts are arranged. In particular, the optoelectronic semiconductor chip is applied in the first recess by means of an electrically insulating bonding agent.

According to at least one embodiment of the method, electrically conductive connections between at least one of the electrical contacts and an electrical connection pad of the control chip are produced by means of a conductor path. For this purpose, the conductor path is applied at least in places to the side surface of the first recess.

According to at least one embodiment of the method, a photoresist is applied to the side surface of the first recess. For example, the photoresist is subsequently exposed and patterned, wherein the side surface of the first recess is exposed in areas. In particular, by exposing the photoresist to light, the photoresist is cured in regions of the side surfaces that are later to be free of the conductor path. During the structuring of the photoresist, the regions of the photoresist that have not been cured are then removed.

Following the exposure and patterning, for example, a metal layer is applied to the photoresist and the exposed regions of the side surface of the first recess. For example, the metal layer is applied by sputtering. For example, the metal layer comprises or is formed from one of the following metals or a mixture of the following metals: Copper, Gold, Platinum. Subsequently, the photoresist is removed to form the conductor path. In particular, after removal of the photoresist, the metal layer remains only in the regions where the conductor path extends. Thus, the metal layer forms the conductor path. Advantageously, with the method described here for applying the conductor path, the conductor path can be brought into direct contact with the side surface along its entire course on the side surface.

With the method described here for applying a conductor path, conductor paths can also be applied to other surfaces of the housing body. Preferably, these surfaces run parallel to the main extension plane of the housing or are inclined at an obtuse angle to it. The greater the tilt angle, the more efficiently the conductor path can be formed with the method described herein. In particular, all steps of the method described herein for applying the conductor path are performed from a direction perpendicular to the main extension plane of the housing.

According to at least one embodiment of the method, the conductor path is mechanically reinforced by electrodepositing a metal. For example, copper is electrodeposited.

According to at least one embodiment of the method, the conductor path is applied at least in places to a bottom surface of the first recess. The conductor path is reinforced by electrodeposition such that the metal is brought into direct contact with the electrical contacts of the semiconductor chip. In particular, the electrical contacts of the optoelectronic semiconductor chip are electrically conductively connected with the conductor path. Advantageously, even in the case where the main surface of the optoelectronic semiconductor chip, at which the electrical contacts are arranged, is arranged perpendicular to the bottom surface of the first recess, an electrically conductive connection between the control chip and the optoelectronic semiconductor chip can thus be produced.

According to at least one embodiment of the method, the mounting surface of the optoelectronic semiconductor chip forms an acute tilt angle with the main surface of the optoelectronic semiconductor chip on which the electrical contacts are arranged, and the conductor path is applied at least in places to the bottom surface of the first recess and the mounting surface of the optoelectronic semiconductor chip. Due to the acute tilt angle between the main surface of the optoelectronic semiconductor chip and its mounting surface, the main surface comprises an obtuse angle with respect to the bottom surface of the first recess. In particular, this makes it possible to apply the method described herein for applying the conductor path to the main surface of the optoelectronic semiconductor chip. Advantageously, this makes it particularly easy to produce an electrically conductive connection between the optoelectronic semiconductor chip and the control chip.

Further advantages and advantageous embodiments and further developments of the optoelectronic semiconductor chip and of the method result from the following exemplary embodiments shown in connection with schematic drawings.

Figure 1B:
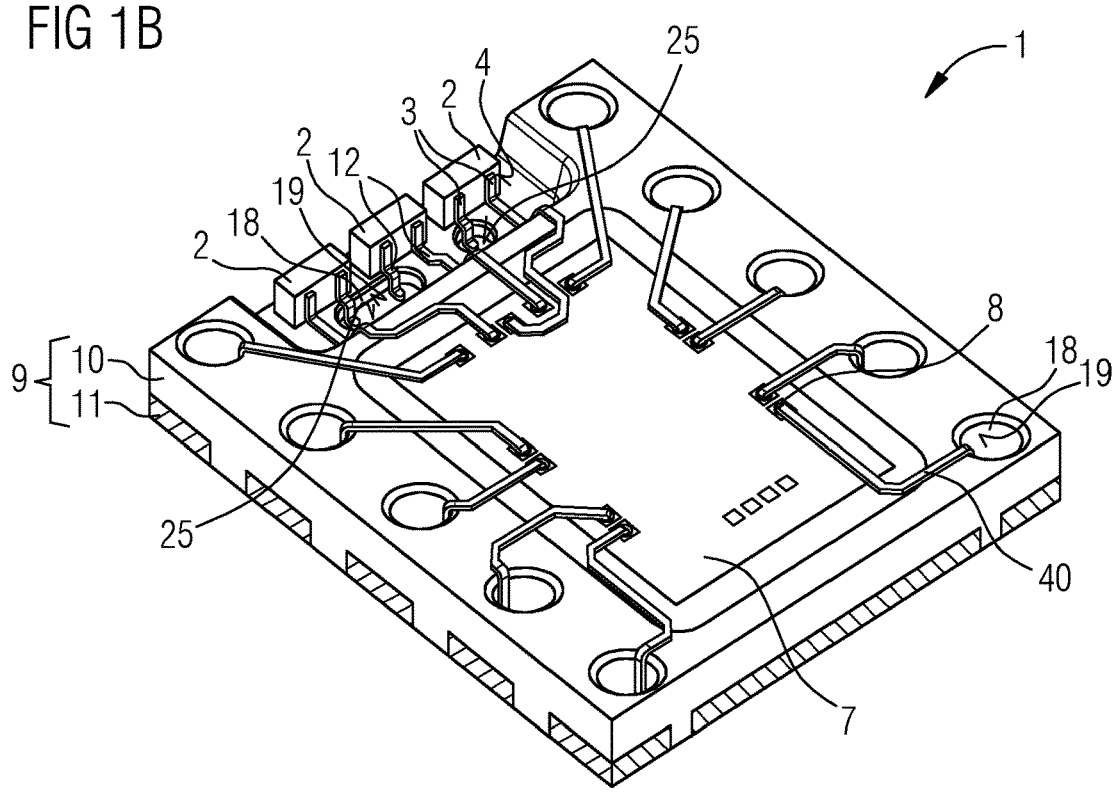
Figure 2A:
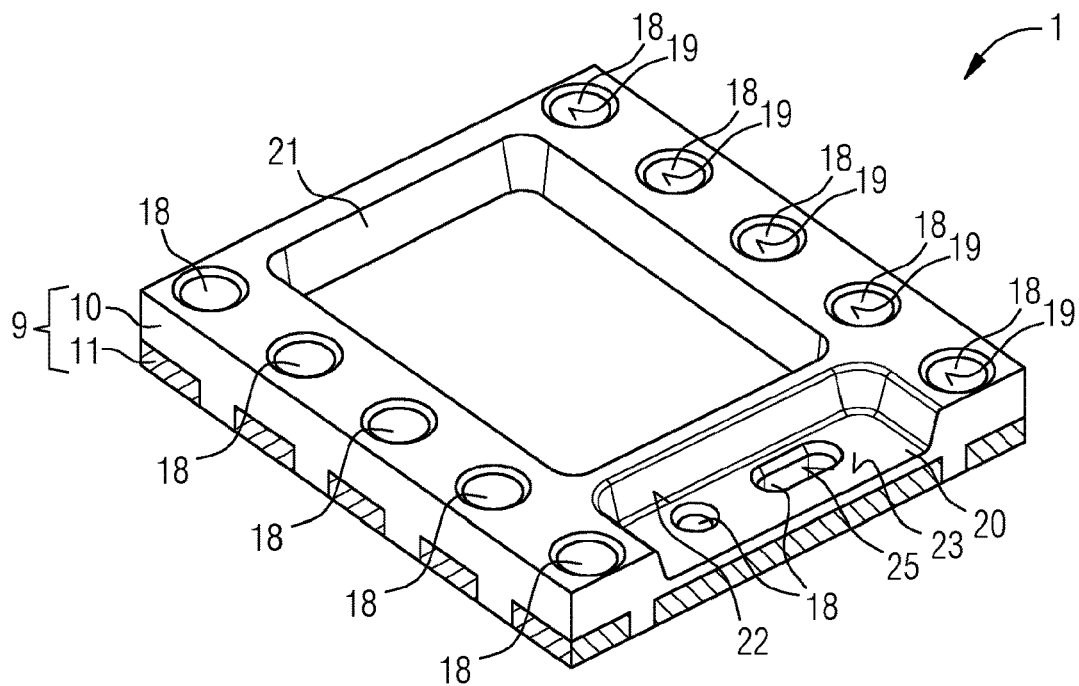
Figure 2B:
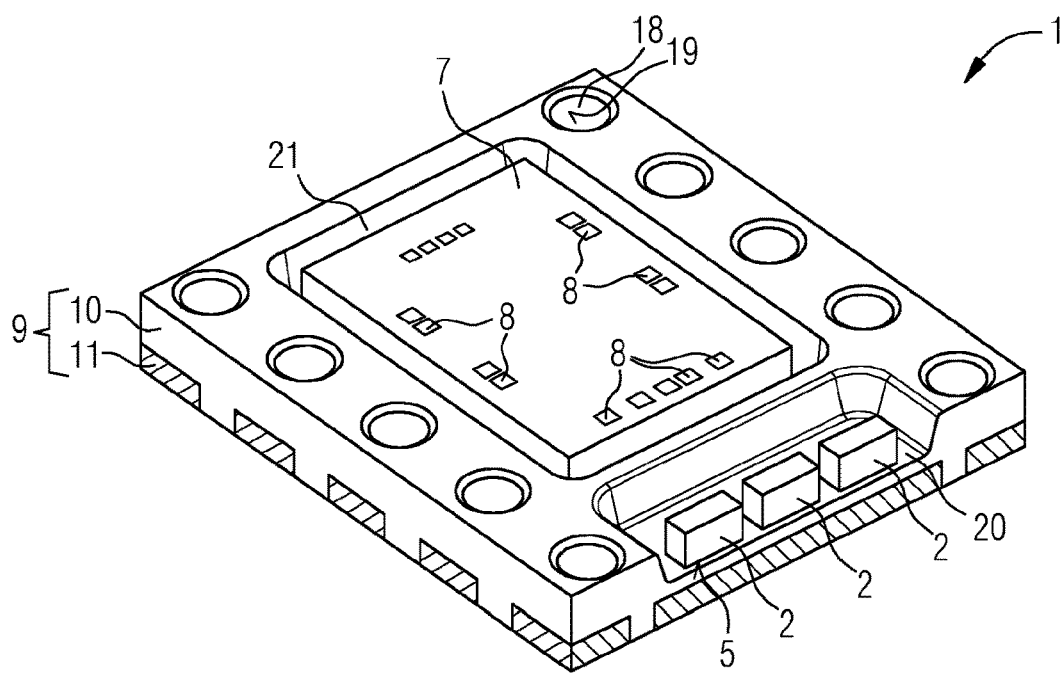
Figure 2C:
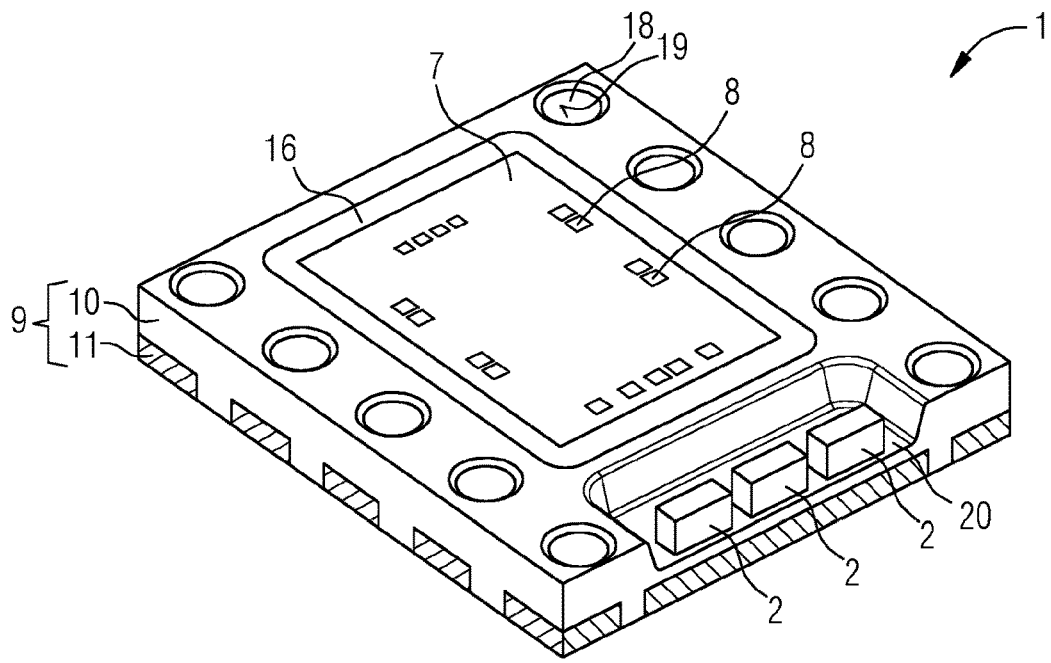
Figure 2D:
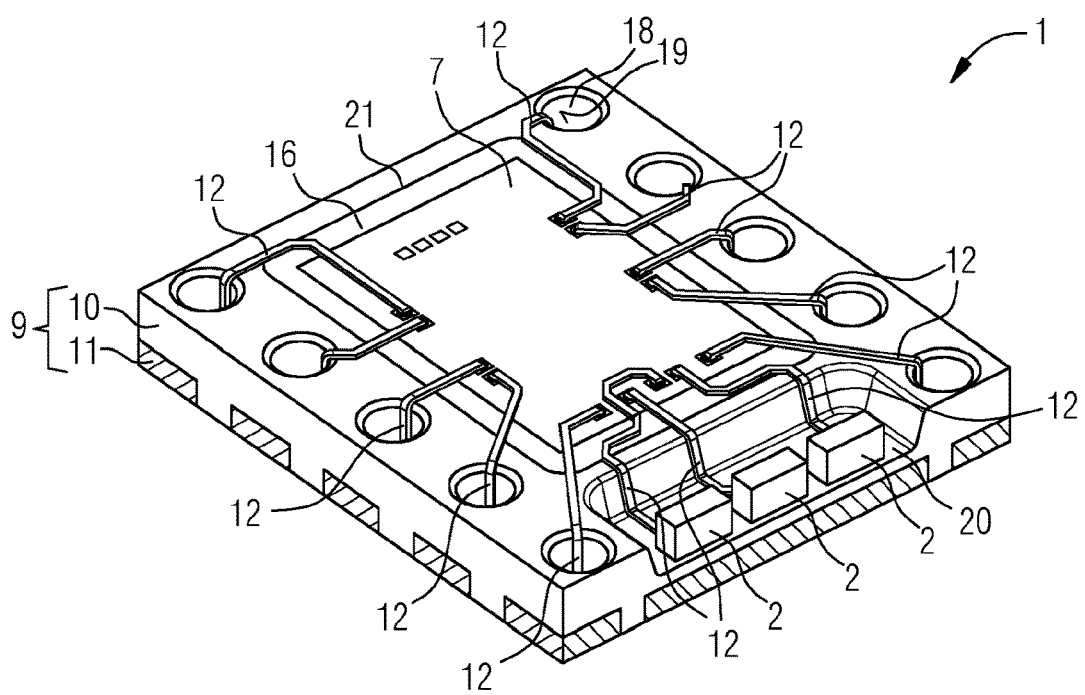
Figure 2E:
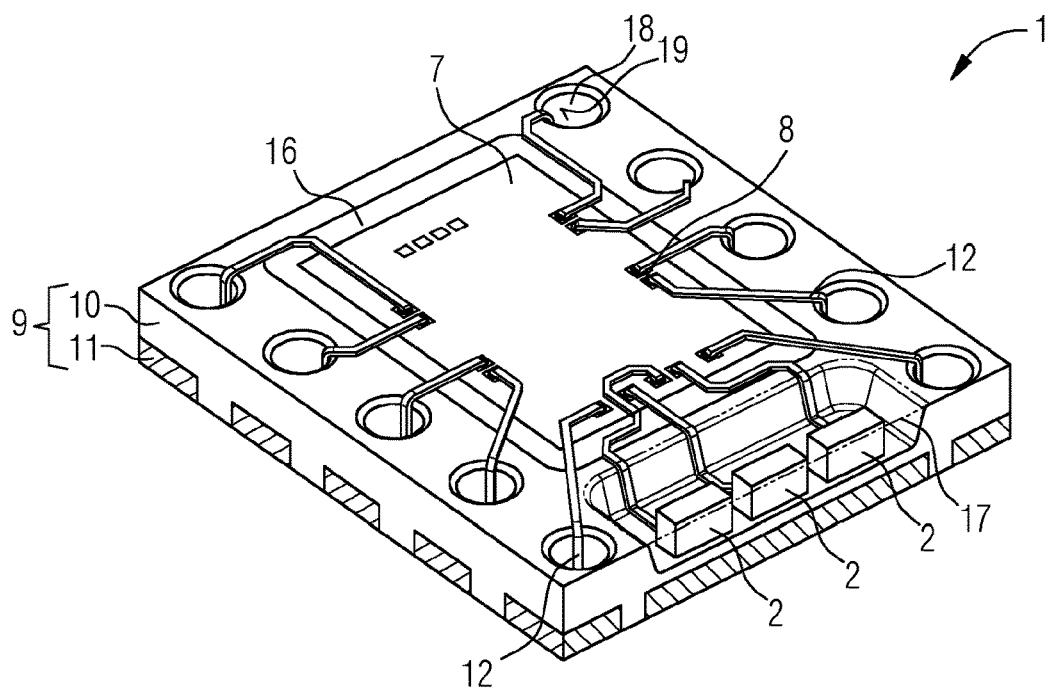
Figure 2F:
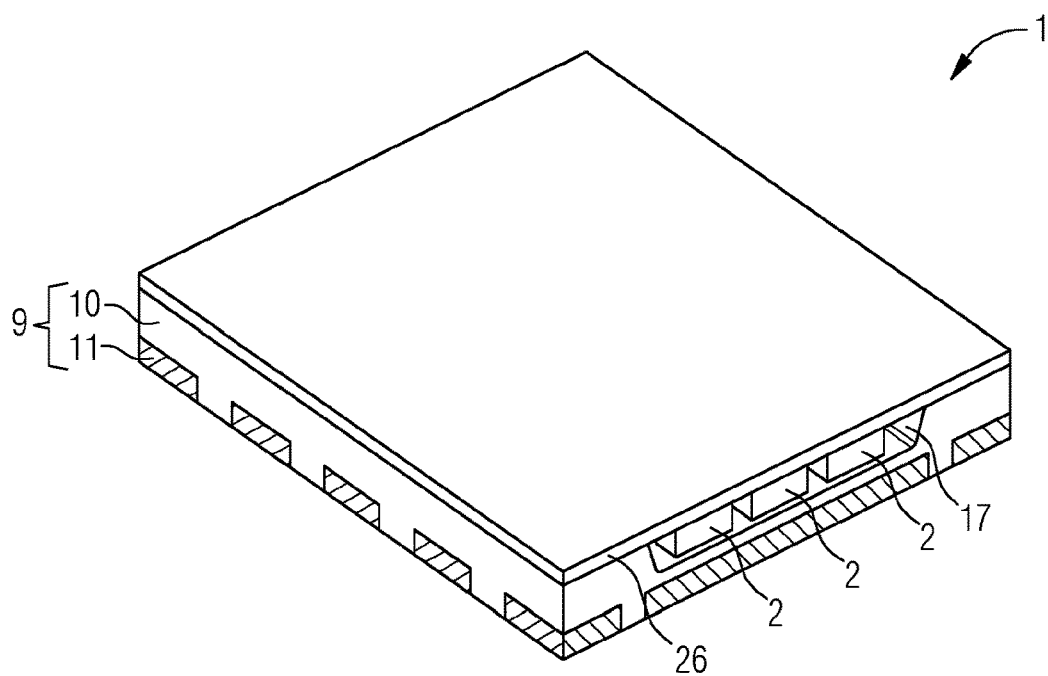
Figure 3A:
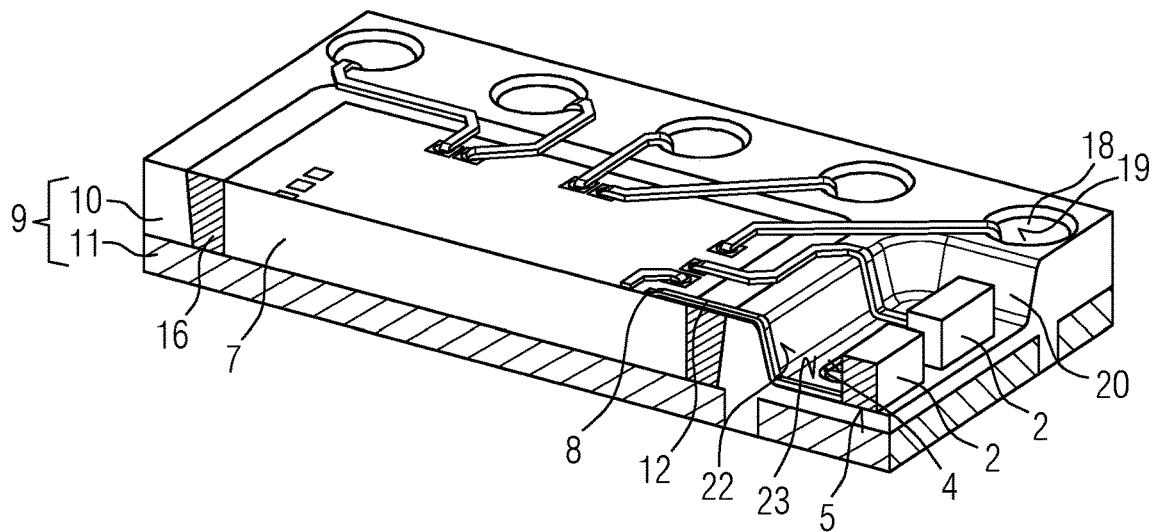
Figure 3B:
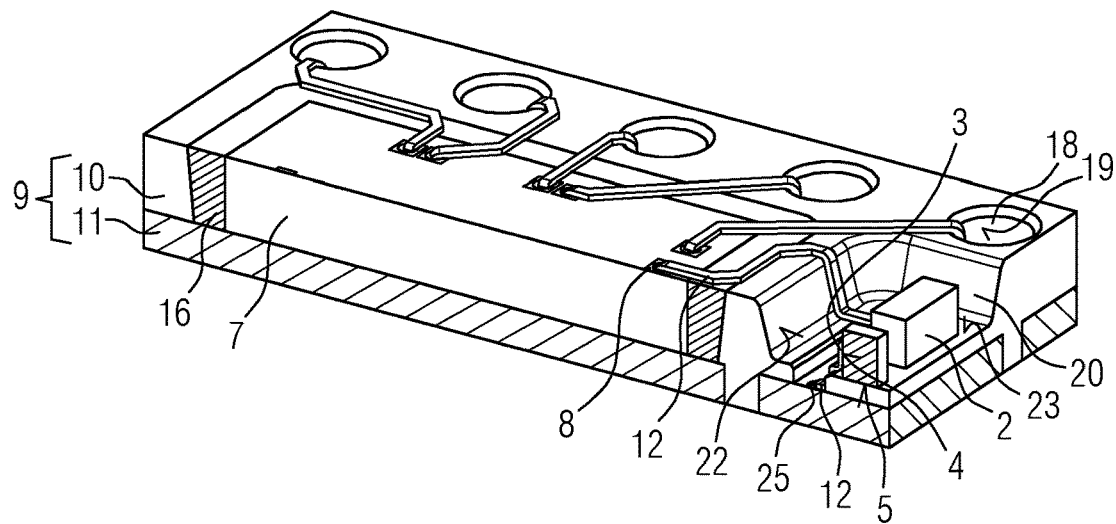
Figure 4A:
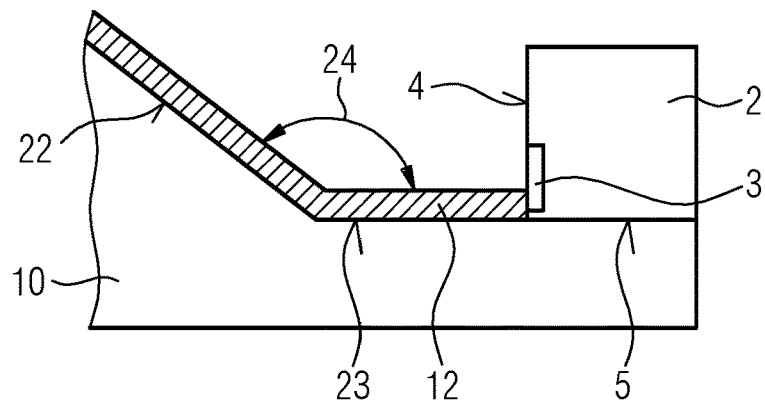
Figure 4B:
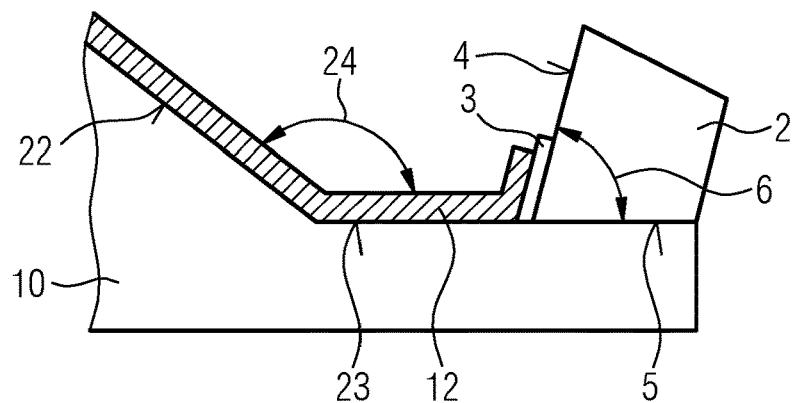
Figure 5A:
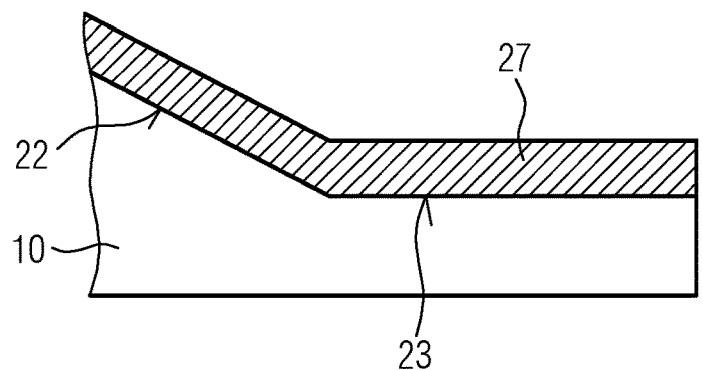
Figure 5B:
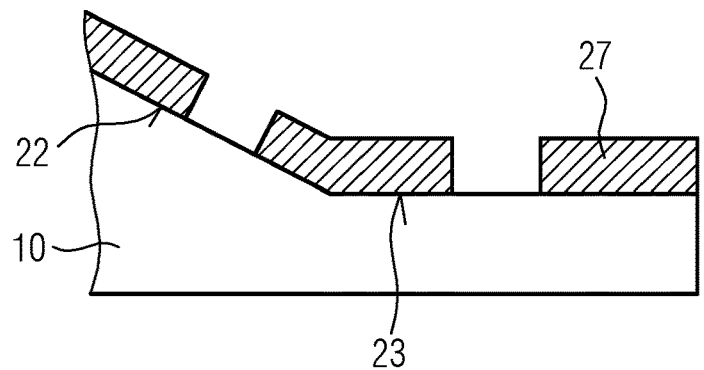
Figure 5C:
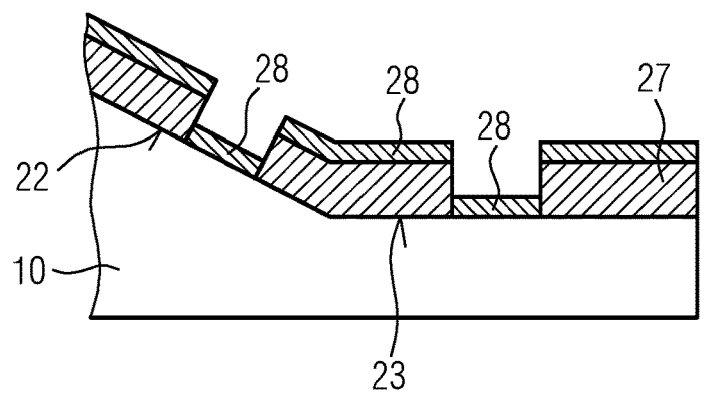
Figure 5D:
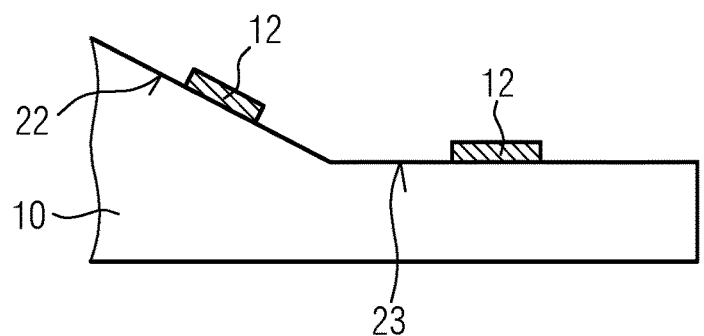
Figure 5E:
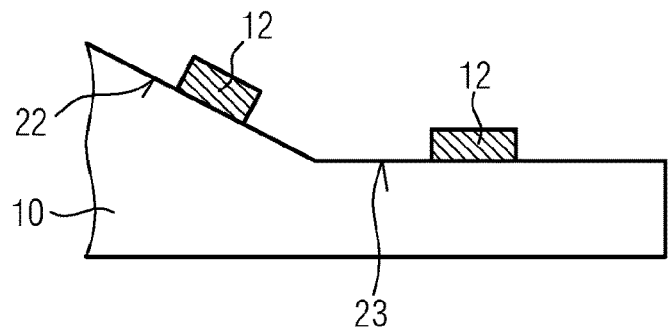
Figure 6:
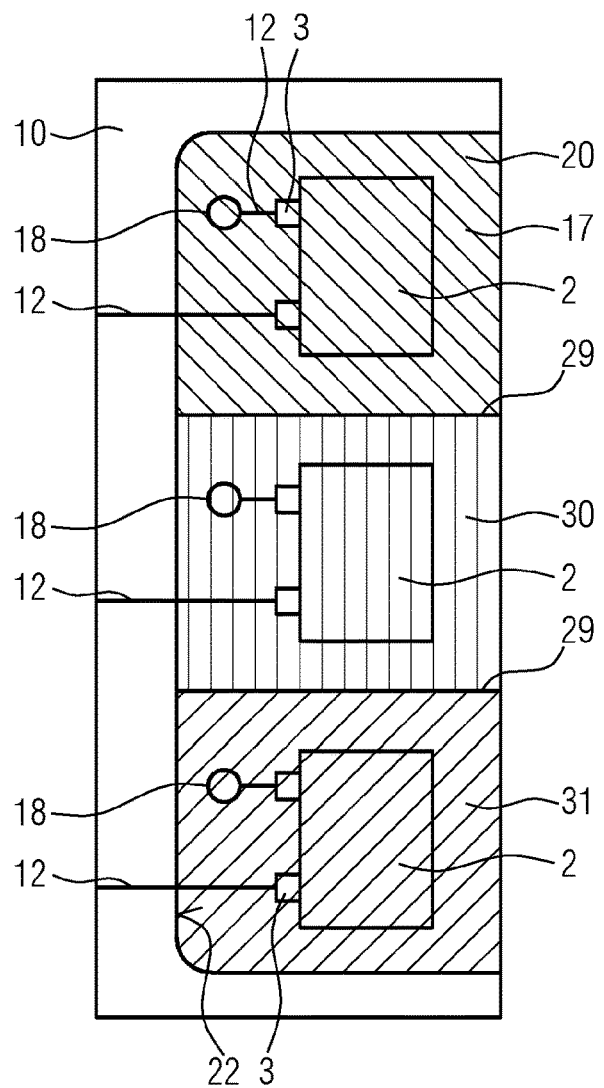

Elements which are identical, similar or have the same effect are provided with the same reference signs in the figures. The figures and the proportions of the elements shown in the figures are not to be regarded as to scale. Rather, individual elements may be shown exaggeratedly large for better representability and/or for better comprehensibility. Showing:

FIGS. 1A and 1B perspective views of an optoelectronic component according to an exemplary embodiment, FIGS. 2A to 2F various process stages of a method for producing the optoelectronic component according to an exemplary embodiment, FIGS. 3A and 3B sectional views of an optoelectronic component according to an exemplary embodiment, FIGS. 4A, 4B and 6 schematic views of a first recess of an optoelectronic component according to three exemplary embodiments, FIGS. 5A to 5E different method stages of a method for applying a conductor path according to an exemplary embodiment.

The optoelectronic component 1 according to the exemplary embodiment of FIGS. 1A and 1B comprises a housing 9 with a housing body 10 in which a leadframe 11 is embedded. The housing body 10 includes a first recess 20, a second recess 21, and a plurality of cutouts 18. A red semiconductor optoelectronic chip 13, a green semiconductor optoelectronic chip 14, and a blue semiconductor optoelectronic chip 15 are arranged in the recess 20. With the term "red semiconductor chip", here and in the following, a semiconductor chip emitting electromagnetic radiation from the red spectral range is meant. With the term "green semiconductor chip" is meant here and in the following a semiconductor chip which emits electromagnetic radiation in the green spectral range. With the term "blue semiconductor chip" is meant here and in the following a semiconductor chip which emits electromagnetic radiation in the blue spectral range.

For example, the blue semiconductor chip 15 is based on a nitride compound semiconductor material. For example, the red and green semiconductor chips 13, 14 are each based on a phosphide compound semiconductor material.

The optoelectronic semiconductor chips 13, 14, 15 each comprise a mounting surface 5 at which they are arranged in the first recess. The first recess comprises a side surface 22 and a bottom surface 23. The side surface 22 and the bottom surface 23 form an obtuse tilt angle. Opposite the side surface 22, the first recess 20 comprises an opening through which electromagnetic radiation generated by the semiconductor chips 13, 14, 15 leaves the optoelectronic component 1 during intended operation. Preferably, the side surface 22 as well as further inner surfaces of the first recess 20 are formed with a reflective material. For example, the reflective material comprises a matrix material such as polyepoxide in which reflective particles, such as titanium dioxide particles, are embedded. Further preferably, the entire housing body 10 is made of such a material.

A control chip 7 is arranged in the second recess 21 of the housing body 10. The control chip 7 comprises a plurality of electrical connection pads 8 on a connection surface facing away from the housing 9. The second recess 21 is filled with an electrically insulating casting 16. Preferably, the control chip 7, the electrically insulating casting 16 and the housing body 10 are flush with each other. For example, the control chip 7 is an application-specific integrated circuit. In particular, the control chip 7 is configured in the intended operation to drive and operate the optoelectronic semiconductor chips 13, 14, 15. For this purpose, each of the optoelectronic semiconductor chips 13, 14, 15 is connected with at least one electrical connection pad 8 of the control chip 7. The electrically conductive connection is produced by a conductor path 12. The conductor path 12 is at least in places in direct contact with the side surface 22 of the first recess 20.

The cutouts 18 of the housing body 10 each comprise a side surface 19. Preferably, contact regions 25 of the leadframe 11 are accessible through the cutouts 18. Along the side surfaces 19 of the cutouts 18 run conductor paths 12, which electrically conductively connect the electrical connection regions 8 of the control chip 7 with the contact surfaces 25 of the leadframe 11. The conductor paths 12 are applied directly to the side surfaces 19 of the cutouts 18 and to the housing body 10.

The optoelectronic component according to the exemplary embodiment of FIG. 1 comprises, for example, a height perpendicular to the main extension plane of between 0.30 millimeters and 0.35 millimeters inclusive. Side surfaces of the housing which extend transversely to the main extension plane and bound the housing comprise, for example, a length of approximately 2 millimeters.

As FIG. 1B shows, a main surface 4 of the optoelectronic semiconductor chips 13, 14, 15 each extends transversely to the mounting surface 5. Two electrical contacts 3 of each of the semiconductor chips 13, 14, 15 are attached to the main surface 4. One of the electrical contacts 3 in each case is electrically conductively connected with an electrical connection pad 8 of the control chip 7 via a conductor path 12. The first recess 20 further comprises two cutouts 18. Contact regions 25 of the leadframe 11 are accessible through the cutouts 18. The electrical contact 3 of each optoelectronic semiconductor chip 13, 14, 15, which is not electrically conductively connected to the control chip 7, is electrically conductively connected to one of the contact regions 25 of the leadframe 11 via a conductor path 12. This conductor path 12 runs along side surfaces 19 of the cutouts 18 of the first recess 20. The side surfaces 19 of the cutouts 18 of the first recess 20 each form an obtuse tilt angle with respect to the contact regions 25 of the leadframe 11.

In the method according to the exemplary embodiment of FIGS. 2A to 2F, a housing 9 is first provided with a housing body 10 and a leadframe 11 embedded therein (FIG. 2A). The housing body 10 comprises substantially the same features as the housing body 10 of FIG. 1A.

In a next step, three optoelectronic semiconductor chips 2 are arranged in the first recess 20 (FIG. 2B). The optoelectronic semiconductor chips 2 comprise a mounting surface 5, by which they are arranged in the first recess 20. For example, the optoelectronic semiconductor chips are arranged in the recess 20 by means of an electrically insulating adhesive. Further, a control chip 7 with a plurality of electrical connection pads 8 is arranged in the second recess 21.

In a next step, the control chip 7 in the first recess 21 is cast with an electrically insulating casting 16 (FIG. 2C). The electrically insulating casting 16 comprises in particular the same features as the casting 16 of FIG. 1A.

In a further step, the contact regions 25 of the leadframe 11 are electrically conductively connected via conductor paths 12 with the electrical connection pads 8 of the control chip 7 (FIG. 2D). In addition, an electrical contact 3 of the optoelectronic semiconductor chip 2 is electrically conductively connected with an electrical connection pad 8 of the control chip 7 via conductor paths 12. The conductor paths 12 run in direct contact with the side surfaces 19 of the cutouts 18 and the side surface 22 of the first recess 20.

In a next step, the first recess 20 is filled with a casting 17 (FIG. 2E). Preferably, the casting 17 of the semiconductor chips is transparent to the electromagnetic radiation emitted by the semiconductor chips 2.

In a next method step, the housing 9 is closed with a cover surface 26 (FIG. 2F). The cover surface 26 comprises the same material as the housing body, for example.

The optoelectronic component according to the exemplary embodiment of FIGS. 3A and 3B comprises essentially the same features as the optoelectronic component 1 of FIG. 1A. A conductor path 12, which connects an electrical contact of an optoelectronic semiconductor chip 2 with an electrical connection pad 8 of the control chip 7, is in direct contact along its entire course with the housing body 10 and in particular with the side surface 22 of the first recess 20.

In particular, the conductor path 12 is in direct contact with the casting 16 of the first recess 21 and the control chip 7.

As FIG. 3B shows, the second electrical contact 3 of the optoelectronic semiconductor chip 2 is in electrically conductive contact with a contact region 25 of the leadframe 11 via a conductor path 12. The conductor path 12 runs on a side surface 19 of a cutout 18 arranged in the first recess 20.

FIG. 4A shows a sectional view of an optoelectronic semiconductor chip 2 arranged on a bottom surface 23 of a first recess 20 of an optoelectronic component 1 described herein. The optoelectronic semiconductor chip 2 comprises a mounting surface 5, which is in contact with the bottom surface 23, and a main surface 4, on which an electrical contact 3 is arranged. In the present case, the main surface 4 extends perpendicularly to the mounting surface 5. A conductor path 12 is arranged on the bottom surface 23 and a side surface 22 of the first recess. The bottom surface 23 forms an obtuse tilt angle 24 with the side surface 22. In the region of the bottom surface 23, the conductor path 12 comprises a thickness, measured perpendicular to the bottom surface 23, which is sufficient for the conductor path 12 to be in direct contact with the electrical contact 3 of the optoelectronic semiconductor chip 2. Advantageously, the optoelectronic semiconductor chip 2 can thus be electrically contacted via the conductor path 12.

In FIG. 4B, a schematic sectional view of an optoelectronic semiconductor chip 2 in a first recess 20 is shown. In contrast to the exemplary embodiment of FIG. 4A, the mounting surface 5 and the main surface 4 form an acute tilt angle 6. It follows that the mounting surface 5 and the bottom surface 23 form an obtuse angle. This obtuse angle allows the conductor path 12 to be applied directly to the main surface 4 of the optoelectronic semiconductor chip 2. In this way, the electrical contact 3 of the optoelectronic semiconductor chip 2 and thus the optoelectronic semiconductor chip 2 can be electrically contacted particularly easily.

In the method for applying the conductor paths 12 according to the exemplary embodiment of FIGS. 5A to 5E, a housing body 10 is coated with a photoresist 27 (FIG. 5A). In FIGS. 5A to 5E, the housing body is shown in the region of a side surface 22 and a bottom surface 23 of a first recess 20. The method shown in FIGS. 5A to 5E can be used, for example, in the method step shown in FIG. 2D according to an exemplary embodiment of the method for producing an optoelectronic component.

In a next step, the photoresist 27 is exposed and patterned to expose regions of the side surface 22, the bottom surface 23 and the housing body 10 along which the conductor paths 12 are to run (FIG. 5B).

In a further method step, a metal layer 28, such as copper, is then applied by sputtering to the photoresist 27 and the regions where the housing body 10 has been exposed (FIG. 5C).

After subsequent removal of the photoresist 27, the regions of the housing body 10 to which the metal layer 28 has been applied then form the conductor paths 12 (FIG. 5D).

In a further optional method step, the conductor path 12 is mechanically reinforced by electrodeposition of a metal (FIG. 5E).

In contrast to the optoelectronic component of FIG. 1A, the first recess 20 of the exemplary embodiment of the optoelectronic component according to FIG. 6 comprises three sections. The sections are separated by parting surfaces 29, each of which extends perpendicular to the side surface 22. An optoelectronic semiconductor chip 2 is arranged in each section. For example, each of the optoelectronic semiconductor chips 2 is a blue semiconductor chip 15.

One of the sections is filled with a transparent casting 17 covering all surfaces of the semiconductor chip 2 except for the mounting surface 5. The other two sections are each filled with a conversion material 30, 31. One of the latter sections is filled with a green conversion material 30, and the other section is filled with a red conversion material 31. By the term "green conversion material" is meant here and hereinafter a conversion material which converts incident radiation of a first wavelength range into radiation in the green wavelength range. The term "red conversion material" is used herein and hereinafter to mean a conversion material that converts incident radiation of a first wavelength range into radiation in the red wavelength range.

The invention is not limited to the exemplary embodiments by the description thereof. Rather, the invention encompasses any new feature as well as any combination of features, which particularly includes any combination of features in the patent claims, even if that feature or combination itself is not explicitly specified in the patent claims or exemplary embodiments.

LIST OF REFERENCE SIGNS 1 optoelectronic component
2 optoelectronic semiconductor chip
3 electrical contacts
4 main surface
5 mounting surface
6 tilt angle of the main surface
7 control chip
8 electrical connection pad
9 housing
10 housing body
11 leadframe
12 conductor path
13 red semiconductor chip
14 green semiconductor chip
15 blue semiconductor chip
16 casting of the control chip
17 casting of the semiconductor chip
18 cutout
19 side surface of the cutout
20 first recess
21 second recess
22 side surface of first recess
23 bottom surface of the first recess
24 tilt angle of the side surface
25 contact region of leadframe
26 top surface
27 photoresist
28 metal layer
29 separation surface
30 green conversion material
31 red conversion material

The invention claimed is:

1. An optoelectronic component comprising:
an optoelectronic semiconductor chip with a main surface on which two electrical contacts are arranged,
a control chip for controlling the optoelectronic semiconductor chip with a plurality of electrical connection pads,
a housing with a housing body,
wherein
the optoelectronic semiconductor chip is arranged with a mounting surface, which extends transversely to the main surface, in a first recess of the housing body,
a side surface of the first recess with a bottom surface of the first recess forming an obtuse tilt angle,
at least one of the electrical contacts of the optoelectronic semiconductor chip is electrically conductively connected to an electrical connection pad of the plurality of electrical connection pads via a conductor path,
the conductor path is on the side surface of the first recess.

2. The optoelectronic component according to claim 1, wherein the obtuse tilt angle comprises a value between 105° and 165°, inclusive.

3. The optoelectronic component according to claim 1, wherein
the housing body comprises a second recess, and
the control chip is arranged in the second recess.

4. The optoelectronic component according to claim 1, wherein the bottom surface of the first recess is electrically insulating at least in a region of the mounting surface of the optoelectronic semiconductor chip.

5. The optoelectronic component according to claim 1, wherein
the housing comprises a leadframe with a plurality of contact regions, which is embedded in the housing body,
electrical connection pads of the plurality of electrical connection pads are electrically conductively connected with a part of the contact regions via conductor paths on the housing body.

6. The optoelectronic component according to claim 1, wherein
the housing comprises a leadframe with a plurality of contact regions, which is embedded in the housing body,
electrical contacts of the optoelectronic semiconductor chip are electrically conductively connected with a part of the contact regions via conductor paths on the housing body.

7. The optoelectronic component according to claim 6, wherein
the contact regions of the leadframe are freely accessible through cutouts of the housing body, and the cutouts comprise side surfaces which are angled with respect to the contact regions of the leadframe.

8. The optoelectronic component according to claim 7, wherein the conductor paths, which electrically conductively connect the electrical connection pads of the plurality of electrical connection pads with a part of the contact regions, are on the side surfaces of the cutouts.

9. The optoelectronic component according to claim 7, wherein the conductor paths, which electrically conductively connect the electrical contacts of the optoelectronic semiconductor chip with a part of the contact regions, are on the side surfaces of the cutouts.

10. The optoelectronic component according to claim 1, wherein the mounting surface of the optoelectronic semiconductor chip forms an acute tilt angle with the main surface of the optoelectronic semiconductor chip on which the electrical contacts are arranged.

11. The optoelectronic component according to claim 1, wherein the optoelectronic semiconductor chip is a first optoelectronic semiconductor chip, the first optoelectronic semiconductor chip is configured to emit red light, and the optoelectronic component further comprises:
a second optoelectronic semiconductor chip configured to emit green light, and
a third optoelectronic semiconductor chip configured to emit blue light.

12. The optoelectronic component according to claim 1, wherein
the optoelectronic semiconductor chip is one of three optoelectronic semiconductor chips emitting electromagnetic radiation of a first wavelength range,
the first recess is divided into three sections which are separated from one another,
one optoelectronic semiconductor chip of the three optoelectronic semiconductor chips is arranged in each section,
and
at least two sections comprise two different conversion materials which convert the electromagnetic radiation of a first wavelength range into electromagnetic radiation of different wavelength ranges.

13. A method for producing an optoelectronic component comprising the following steps:
providing a housing with a housing body comprising a first recess, wherein a side surface of the first recess forms an obtuse tilt angle with a bottom surface of the first recess,
arranging a control chip with a plurality of electrical connection pads on the housing body,
applying an optoelectronic semiconductor chip with a mounting surface in the first recess, wherein the mounting surface extends transversely to a main surface of the optoelectronic semiconductor chip, on which two electrical contacts are arranged,
producing an electrically conductive connection between at least one of the electrical contacts and an electrical connection pad of the plurality of electrical connection pads by way of a conductor path on the side surface of the first recess.

14. The method according to claim 13, wherein applying the conductor path comprises the following steps:
applying a photoresist to the side surface of the first recess,
exposing and patterning the photoresist, wherein the side surface of the first recess is exposed in regions,
applying a metal layer to the photoresist and the exposed regions of the side surface of the first recess,
removing the photoresist to form the conductor path.

15. The method according to claim 14, wherein the conductor path is mechanically reinforced by electrodeposition of a metal.

16. The method according to claim 13, wherein
the conductor path is on a bottom surface of the first recess,
the conductor path is reinforced by electrodeposition of a metal such that the metal is brought into direct contact with an electrical contact of the optoelectronic semiconductor chip.

17. The method according to claim 13, wherein the mounting surface of the optoelectronic semiconductor chip forms an acute tilt angle with the main surface of the optoelectronic semiconductor chip on which the electrical contacts are arranged, and
the conductor path is on a bottom surface of the first recess and the mounting surface of the optoelectronic semiconductor chip.

* * * * *